United States Patent [19]
Doyle et al.

[11] Patent Number: 5,170,373
[45] Date of Patent: Dec. 8, 1992

[54] THREE TRANSISTOR EEPROM CELL

[75] Inventors: Bruce A. Doyle, Flower Mound; Randy C. Steele, Southlake; Safoin A. Raad, Irving, all of Tex.

[73] Assignee: SGS-Thomson Microelectronics, Inc., Carrollton, Tex.

[21] Appl. No.: 429,308

[22] Filed: Oct. 31, 1989

[51] Int. Cl.$^5$ .................... G11C 7/00; G11C 16/00
[52] U.S. Cl. .................... 365/185; 365/104; 365/189.08; 307/465; 257/315
[58] Field of Search .......... 365/185, 187, 189.01, 365/189.08; 357/23.5, 23.6; 307/465, 468

[56] References Cited

U.S. PATENT DOCUMENTS

| | | | |
|---|---|---|---|
| 4,715,014 | 12/1987 | Tuvell et al. | 365/187 X |
| 4,813,018 | 3/1989 | Kobayashi et al. | 365/185 |
| 4,855,955 | 8/1989 | Cioaca | 365/187 X |
| 4,907,198 | 3/1990 | Arima | 365/185 |
| 4,935,698 | 6/1990 | Radjy et al. | 365/185 X |
| 4,963,769 | 10/1990 | Hiltpold et al. | 307/465 |
| 5,005,155 | 4/1991 | Radjy et al. | 365/185 |
| 5,101,378 | 3/1992 | Radjy et al. | 365/185 |

FOREIGN PATENT DOCUMENTS

| | | | |
|---|---|---|---|
| 284724 | 10/1988 | European Pat. Off. | |
| 0297540 | 1/1989 | European Pat. Off. | 365/185 |
| 62-266793 | 11/1987 | Japan | 365/185 |
| 8202275 | 7/1982 | PCT Int'l Appl. | |

OTHER PUBLICATIONS

IEEE International Solid State Circuits Conference, 'A 16ns CMOS EEPLA with Reprogrammable Architecture'; vol. 33, pp. 240-241, Feb. 1986, New York, U.S.
Electronics, '16-K EE-PROM relies on tunneling for byte-erasable program storage', pp. 113-117, vol. 52, No. 5, Feb. 28, 1980, New York, U.S.
IBM-TDB vol. 25, No. 1 Jun. 1985 by Chao Electrically Alterable Read Only Memory Array.

*Primary Examiner*—Alyssa H. Bowler
*Attorney, Agent, or Firm*—Kenneth C. Hill; Lisa K. Jorgenson; Richard K. Robinson

[57] ABSTRACT

An EEPROM cell suitable for use in programmable logic devices contains three transistors. A floating gate transistor is used to retain a programmed value using charge storage on the floating gate. A read transistor is connected between the floating gate transistor and an output signal line, and used to access the value stored in the floating gate transistor. A write transistor is connected to the floating gate transistor opposite the read transistor, and is used when programming the floating gate transistor. The write transistor and its associated control circuitry are fabricated to handle the higher programming voltages required by the floating gate device. The read transistor and associated drive circuitry are not required to handle the higher programming voltages, and can be fabricated using smaller, faster devices.

8 Claims, 2 Drawing Sheets

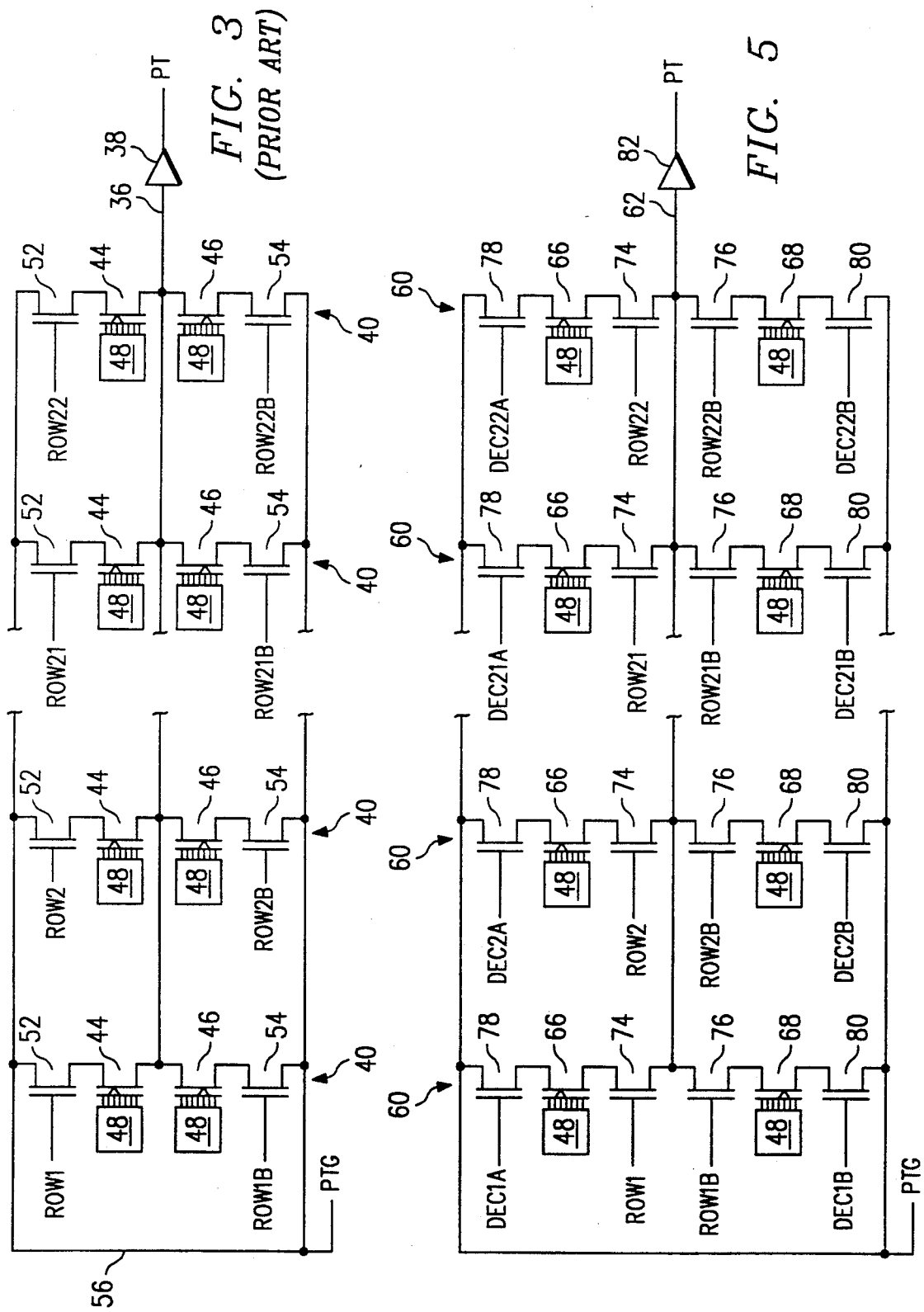

THREE TRANSISTOR EEPROM CELL

BACKGROUND OF THE INVENTION

1. Field of the Invention

The present invention relates generally to integrated circuits, and more specifically to an electrically erasable programmable read only memory circuit.

2. Description of the Prior Art

Electrically erasable programmable read only memory (EEPROM) finds a wide variety of uses in the electronics industry. They can be used as stand alone memories, such as used with microcomputer systems and controllers. EEPROM memory may also be embedded into various types of user programmable devices, many of which are referred to generally as field programmable logic devices.

EEPROM memory cells can be used in some types of programmable logic devices to store configuration information for such devices. They are also used to define switch connections in an AND-OR array, such as used in programmable logic arrays and more sophisticated devices which are programmed in a similar way.

EEPROM cells, each containing a memory bit, are programmed ON using a high voltage signal to inject charge onto a floating gate. These cells are programmed off by reversing the polarity of the high voltage, and removing charge from the floating gate. Once programmed, the charge on the floating gate causes the floating gate device to behave as a field effect transistor which remains switched either on or off.

The higher voltages needed for programming EEPROM cells require physically larger transistors in other parts of the device which also encounter these higher voltages. These larger devices are necessary in order to avoid hot electron effects and punch through as known in the art. These larger transistors operate at a slower speed than smaller ones, decreasing the overall operating speed of the device.

Read/write transistors used to access the floating gate transistors are among those which must be able to handle the higher programming voltages. In addition to their larger size, the circuitry used to drive these transistors must be fabricated using N-channel technology. CMOS circuitry cannot be used to drive the read/write transistors because the higher voltage used therein makes the drive circuitry more susceptible to latch-up problems. Since N-channel technology is used in the driving circuitry, the maximum signal which can be applied to turn on the read/write transistors during normal operation is $V_{cc} - V_{Tn}$. This lower driving voltage provides less signal margin for the read/write transistors, and results in slower operation. Bootstrapping can be used to raise the signal back to $V_{cc}$, but the necessary circuitry adds delay.

The design of current EEPROM cells results in undesirable capacitive loads, especially as used in an AND-OR array on a programmable logic device. These capacitive loads increase the switching time of the programmable logic device, reducing its performance.

It would be desirable to provide an EEPROM cell which overcomes many of the important limitations described above. It would be desirable for such a cell to provide improved performance while being compatible with current process technology.

SUMMARY OF THE INVENTION

It is therefore an object of the present invention to provide an EEPROM cell with improved performance.

It is a further object of the present invention to provide such an EEPROM cell which is suitable for use in programmable logic devices.

It is another object of the present invention to provide such an EEPROM cell which is suitable for use in AND-OR arrays within programmable logic devices.

Therefore, in accordance with the present invention, an EEPROM cell suitable for use in programmable logic devices contains three transistors. A floating gate transistor is used to retain a programmed value using charge storage on the floating gate. A read transistor is connected between the floating gate transistor and an output signal line, and used to access the value stored in the floating gate transistor. A write transistor is connected to the floating gate transistor opposite the read transistor, and is used when programming the floating gate transistor. The write transistor and its associated control circuitry are fabricated to handle the higher programming voltages required by the floating gate device. The read transistor and associated drive circuitry are not required to handle the higher programming voltages, and can be fabricated using smaller, faster devices.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 3 is a schematic diagram of a portion of a programmable logic device as known in the prior art;

FIG. 5 is a schematic diagram of a portion of a programmable logic device utilizing the EEPROM cell of the present invention.

DESCRIPTION OF THE PREFERRED EMBODIMENT

Figure 1:
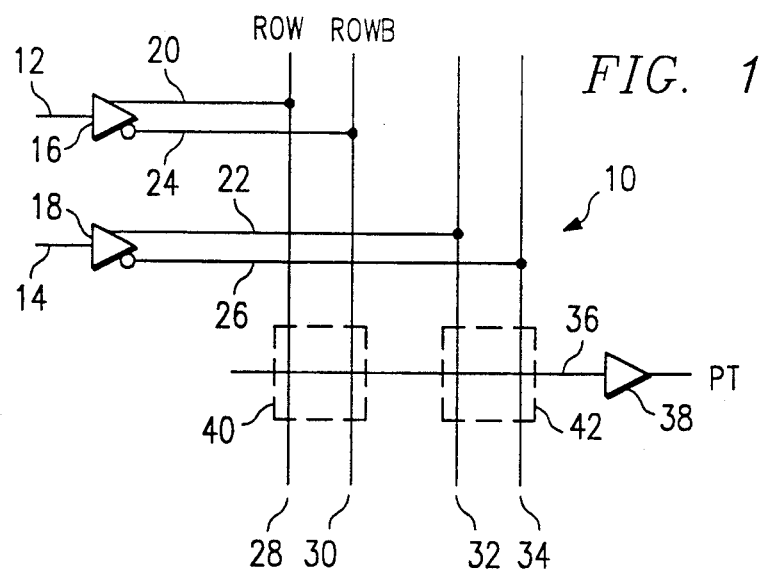
FIG. 1 is a schematic diagram of a portion of a programmable logic device.

Referring to FIG. 1, a portion of an AND-OR array of a programmable logic device 10 is shown. Input signal lines 12, 14 carry input signals provided from off chip. Input signal lines 12, 14 are connected to input buffers 16, 18 respectively. Each input buffer 16, 18 provides a true signal line 20, 22 and a complement signal line 24, 26. Only two input signal lines 12, 14 and input buffers 16, 18 are shown in FIG. 1, but an actual device typically has a much larger number.

Each of the signal lines 20-26 is connected to a row line 28, 30, 32, 34. Row lines 28 and 30, designated with the signals ROW and ROWB carry complementary signals determined by the input on line 12. Likewise, row lines 32, 34 contain complementary signals determined by the input on line 14. In addition to input signals, additional row lines can be used to carry feedback signals from output registers (not shown).

A product signal line 36 crosses all of the row lines 28-34, and drives a sense amplifier 38. Sense amplifier 38 generates output signal PT. Only one product signal line 36 is shown, but it is understood that many such lines are included in actual devices. A typical device might include, for example, 44 row lines and 122 product signal lines.

As known in the art, the signal available on line 36 is determined by programmed connections made between the row lines 28-34 and the product signal lines 36. Connections are made at the intersections of these lines by using transistor switches. In field programmable logic devices, a typical transistor switch includes an EEPROM cell which is programmed ON or OFF in order for the connection at any particular point to be made or not made, respectively. EEPROM cells are typically built in pairs, with a single EEPROM cell pair 40, 42 having two switches and being programmed to determine the connections between one product signal line 36 and one row and its complement. In the example above, a device having 44 row lines (22 pairs) and 122 product signal lines would include 2684 EEPROM cell pairs in the AND-OR array.

Figure 2:
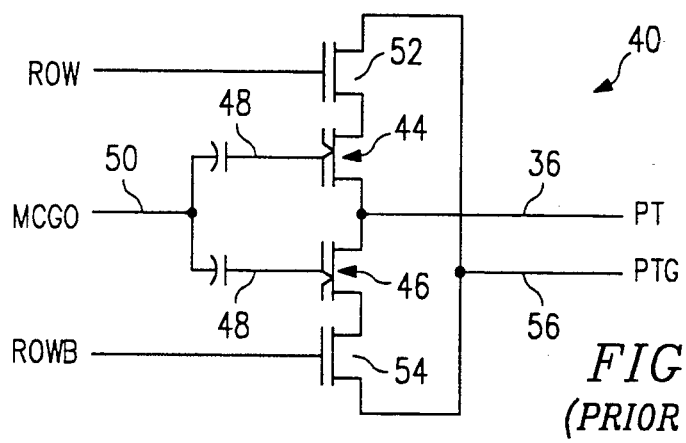
FIG. 2 is a schematic diagram of an EEPROM cell utilized in the prior art.

Referring to FIG. 2, an EEPROM cell pair 40 as used in the prior art is shown. Floating gate devices 44, 46 are connected to product signal line 36. Each device contains a floating gate node 48 which is capacitively coupled to a programming voltage supply line 50. Read/write transistors 52, 54 are connected between floating gate devices 44, 46, respectively, and product term ground signal line 56.

During normal operation of the device, signal line 56 is connected to device ground. The signals ROW and ROWB are used to switch read/write transistors 52, 54 respectively. As described above, the signals ROW and ROWB are complementary, so that only one of the read/write transistors 52, 54 is switched on at all times.

As known in the art, the floating gate devices 44, 46 are programmed ON by storing charge on their respective nodes 48. If floating gate device 44 is programmed ON, and ROW is high, output signal line 36 is connected to ground through floating gate device 44 and transistor 52. If floating gate device 44 is programmed OFF, device 44 is non-conductive and signal line 36 is not connected to ground. Floating gate device 46 and transistor 54 operate on a similar fashion.

Floating gate device 44 is programmed ON by tunneling charge onto the floating gate node 48 through a thin gate oxide. This is accomplished by driving the signals ROW and PTG to a super voltage while grounding the signal MCGO. The super voltage is substantially higher than the normal operating voltage of the programmable logic device. For example, for a device which normally operates using a supply voltage of 5 volts, the programming super voltage is typically 12-18 volts.

With MCGO at ground, and ROW and PTG at the super voltage, signal line 56 has a net positive charge on it with respect to the floating gate node 48. Electrons flow from node 48 to signal line 56 through the gate oxide of floating gate device 44 and through transistor 52. After this tunneling has been completed signal line 56 is connected to ground, leaving a net positive charge on floating gate node 48. This causes floating gate device 44 to be ON, providing a DC current path between read/write transistor 52 and output signal line 36.

To program floating gate device 44 OFF, MCGO and ROW are driven to the super voltage and the signal PTG is grounded. This causes the floating gate node 48 to have a net positive charge with respect to signal line 56, causing electrons to tunnel through the gate oxide onto floating gate node 48. When supply line 50 is grounded, a net negative charge is left on the floating gate node 48. This turns floating gate device 44 OFF, providing an open circuit between transistor 52 and signal line 36. During normal operation of the device, both signals MCGO and PTG are grounded.

FIG. 3 illustrates a portion of a programmable logic device having a plurality of prior art EEPROM cell pairs 40 connected to a product signal line 36. In the example shown in FIG. 3, 22 different true and complement row pairs are connected to each signal line 36.

The floating gate devices 44 and 46 have a relatively large capacitance regardless of whether they are programmed ON or OFF. Since all of the floating gate devices 44, 46 are connected to the product signal line 36, a relatively large lumped capacitance is attached to such signal line 36. As will be appreciated by those skilled in the art, the existence of this capacitance greatly decreases the speed at which the voltage level of line 36 can change. If the combination of floating gate device programming and ROW inputs causes the voltage level on line 36 to change from high to low, or vice versa, the capacitive load provided by the floating gate devices 44, 46 limits the rate of which such change can occur.

The read/write transistors 52, 54 must have a larger than minimum size because of the super voltage signals applied across their source/drains when the gate is low during programming. Larger transistors induce a larger capacitive load than do smaller transistors, which further increases the time required for the signal on output line 36 to change state.

Since the ROW and ROWB signals are driven to a super voltage during programming, additional circuitry must be included to bias the signals during programming. This additional circuitry provides a capacitive load on the lines used to generate ROW and ROWB, thereby decreasing the switching speed of these signals. Since ROW and ROWB must be driven to the super voltage during programming, only N-channel devices can be used in the driving circuitry for these signals. This is necessary in order to prevent a potential latch-up situation which could occur if CMOS devices were used. Since only N-channel devices can be used, the signals ROW and ROWB can never be driven completely to the supply voltage, but instead are limited to $V_{cc}-V_{Tn}$ unless the signals are bootstrapped. This smaller voltage swing for the signals ROW and ROWB further decreases the switching speed of these signals.

In an AND-OR array, the signals ROW and ROWB are the inverse of each other. Thus, one signal rises when the other signal falls. It is preferable to have both signals change symmetrically in order to ensure equivalent data access times in both directions. In the cell pair 40, if only one of the floating gate devices 44, 46 is programmed ON, there will exist a unidirectional coupling on signal line 36 when the signals ROW and ROWB switch.

This coupling is due to the Miller capacitance created by the gate/drain overlap of the floating gate devices 44, 46 in conjunction with that of devices 52 and 54. For a cell programmed ON, the signal on line 36 will be pulled to a low level through that cell. As ROW rises, charge is coupled onto signal line 36 by the Miller capacitance. This charge must subsequently be removed through the channel of the floating gate device before the signal on line 36 can reach its low level.

The converse occurs when one or more of the ROW floating gate devices 44 are programmed on while all of the ROWB floating gate devices 46 are programmed OFF. When all of the ROW signals are switched off all of the ROWB signals are switched on, and the signal on output line 36 is coupled low from an already low state. Thus, in order to return from a low level on signal line 36 to a high level, signal line 36 must actually recover from an artificially low state below its normal low value.

In both of the situations just described, the extra charge transfer which occurs causes a delay in correctly biasing the signal on line 36. This delay further increases the switching time of the device.

Figure 4:
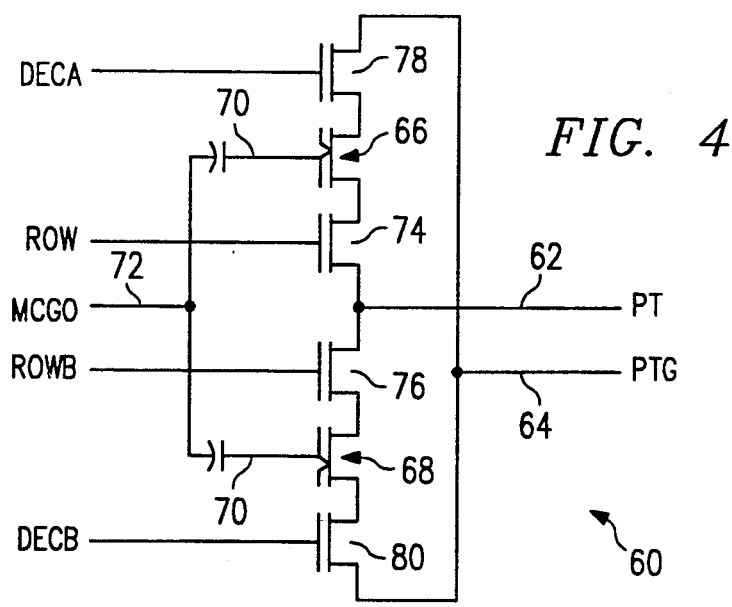
FIG. 4 is a schematic diagram of an improved EEPROM cell according to the present invention.

An EEPROM cell pair incorporating two improved cells is shown in FIG. 4. Cell pair 60 includes connections to product term output signal line 62 and product term ground 64. These two signal lines 62, 64 function in a manner substantially equivalent to their counterpart signal lines 36 and 56 in the prior art cell pair 40.

Cell pair 60 includes floating gate devices 66 and 68, each of which has a floating gate node 70. The floating gate nodes 70 are capacitively coupled to programming voltage supply line 72, driven by the signal MCGO.

Floating gate devices 66, 68 are connected to the output signal line 62 through select, or read, transistors 74 and 76 respectively. Floating gate devices 66, 68 are connected to the product term ground signal line 64 through decode, or programming, transistors 78 and 80 respectively. Read transistors 74, 76 are driven by the ROW and ROWB signals, respectively, and the programming transistors 78, 80 are driven by the decode signals DECA and DECB, respectively.

The floating gate devices 66, 68 are programmed in a similar fashion to that used for the prior art devices. To program the floating gate devices ON, MCGO is grounded and PTG is driven to the super voltage. For each floating gate device 66, 68 which is to be programmed ON, the corresponding decode signal DECA or DECB, is also driven to the super voltage. This causes tunneling to produce a net positive charge on the floating gate node 70 of the corresponding floating gate device 66 or 68.

In order to program a floating gate device 66 or 68 OFF, MCGO is driven to the super voltage while PTG is grounded. DECA and DECB are driven to the super voltage for all of the associated floating gate devices 66, 68 which are to be programmed OFF. Tunneling causes a net negative charge to occur on the selected floating gate nodes 70. During normal operation of the device, both MCGO and PTG are grounded.

During normal operation of the cell pair 60, both signals DECA and DECB are driven to the positive supply voltage at all times. A depletion-mode N-channel device (not shown) can be used to bring the DECA and DECB signals up to $V_{cc}$. Such a device adds some delay to the driving circuitry, but this does not matter since DECA and DECB never change during normal operation of the device. Since only N-channel devices can be used in the driving circuitry for the signals DECA and DECB, the signals will actually have a voltage limited to $V_{cc}-V_{Tn}$. This is sufficient to bias programming transistors 78, 80 ON, and has no adverse effect because these transistors are never switched during normal operation.

Since ROW and ROWB are complements, one of the select transistors 74 or 76 will always be on. If the associated floating gate device 66 or 68 is programmed ON, signal line 62 will be connected to ground. If the associated floating gate device 66, 68 is programmed OFF, signal line 62 will not be connected to ground.

High voltages are applied to the floating gate devices 66, 68 for programming as in the usual case. High voltages are also applied to programming transistors 78, 80, which must be of a larger size for the reasons described above. The select transistor 74, 76, which are the ones actually switched during normal operation of the device, are never driven using high programming voltages. Therefore, these devices may be made smaller, resulting in faster switching during normal operation.

Referring to FIG. 5, a plurality of improved cells 60 are shown connected to an output signal line 62. Signal line 62 is connected to sense amplifier 82, which drives the signal PT. The sense amplifier 82 includes a resistive pull-up element (not shown), which pulls the voltage on signal line 62 up to a one level when none of the cell pairs 60 contains a DC path to ground.

It will become apparent from FIG. 5 that only one half of the floating gate devices 66, 68 will be connected to product term signal line 62. This occurs because only one of the select transistors 74, 76 is on for each row. The select transistors 74, 76 can be designed using minimum channel length devices, since they are not required to handle high voltages during programming. The capacitive load of these transistors 74, 76 is therefore much smaller than that of the floating gate devices 66, 68. This minimizes the capacitive load on signal line 62.

Since the ROW and ROWB signals are not driven to the programming super voltage, CMOS circuitry can be used to drive them. This allows the signals ROW and ROWB to actually be driven all the way to the supply voltage. This larger voltage swing than that found in the prior art devices improves their signal margin and allows faster switching times. In addition, there is no high voltage driver circuitry connected to the ROW and ROWB signals. This results in a lower capacitance in the driving circuitry, allowing ROW and ROWB to switch faster and contribution to further decreased switching times of the device.

The unidirectional coupling which occurs on signal line 62 in the prior art devices does not occur in the improved EEPROM cell pair 60. Both of the switching transistors 74 and 76 are connected directly to signal line 62, and driven by complementary signals ROW and ROWB. When one select transistor switches off, the other switches on. Any charge coupling caused by switching one select transistor is balanced by the switching of the other select transistor in the opposite direction. Thus, a smaller net effect is seen on signal line 62 due to various charge coupling mechanisms.

Although some extra layout area is required for the improved EEPROM cell, a significant speed increase is realized using such improved structure. The area required for the AND-OR array on a programmable logic device is generally not the major portion of the area of the entire device. Thus, a percentage increase for layout area in this region of up to 20% or 25% does not greatly impact the overall area required for fabrication of the device. In return for this small area penalty, significant speed increases are realized for the overall device without requiring a change in fabrication technology.

While the invention has been particularly shown and described with reference to a preferred embodiment, it will be understood by those skilled in the art that various changes in form and detail may be made therein without departing from the spirit and scope of the invention.

What is claimed is:

1. An array junction switch element for a programmable logic device comprising:
   an output signal line;
   first and second floating gate transistors, each storing one bit of connection information as charge stored on floating gates thereof;
   first and second select transistors connected between said first and second floating gate transistors, respectively, and said output signal line;
   first and second programming transistors connected between said first and second floating gate transistors, respectively, and a supply voltage; and
   means for controlling said first and second floating gate transistors to be programmed by transferring charge between the gates thereof and the supply voltage through said first and second programming transistors, respectively, and means for controlling said first and second floating gate transistors to be read by turning on said first and second select transistors, respectively;
   wherein said first and second programming transistors are physically larger than said select transistors, and wherein programming voltages higher than a normal operating voltage are applied only to said programming transistors.

2. The cell of claim 1, further comprising means for raising the supply voltage to a programming voltage level to store charge onto the charge storage node, and causing it to remain at a ground potential otherwise.

3. The cell of claim 1, further comprising a second supply voltage capacitively coupled to charge storage node, and means for raising the second supply voltage to a programming voltage level to allow charge to be removed from the charge storage node, and causing it to remain at ground potential otherwise.

4. The cell of claim 3, further comprising means for raising the supply voltage to a programming voltage level to store charge onto the charge storage node, and for causing it to remain at a ground potential otherwise.

5. The cell of claim 1, further comprising means for, during normal operation, switching said programming transistor on at all times, connecting the supply voltage to ground, and switching said select transistor on in response to a high voltage applied to its control input, whereby, when said select transistor is switched on, the output signal line is connected to ground if said floating gate transistor is controlled to be on by the floating gate, and the output signal line is not connected to ground through the cell otherwise.

6. The switch element of claim 1, further comprising means for, during normal operation, switching said programming transistors on at all times, connecting the supply voltage to ground, and switching said select transistors on in response to a high voltage applied to their control inputs, whereby, when said select transistors are switched on, the output signal line is connected to ground if the connected floating gate transistor is controlled to be on by its floating gate, and the output signal line is not connected to ground through the cell otherwise.

7. A programmable logic device, having an AND-OR array containing input signal rows and product term signal lines, wherein each junction of a row with a product term signal line contains a switching element comprising:
   a select transistor connected to an output signal line and having a select control input;
   a floating gate transistor connected to said select transistor, wherein operation of said floating gate transistor is controlled by charge stored on charge storage node, wherein charge is stored on and removed from the charge storage node through a gate oxide suitable for charge tunnelling, and wherein turning on of said select transistor in response to a select control input signal causes the output signal line to indicate the presence or absence of charge on the charge storage node; and
   a programming transistor connected in series to said floating gate transistor and to a supply voltage, and having a programming control input, wherein charge stored on the charge storage node is provided from the supply voltage through said programming transistor;
   wherein said programming transistor is physically larger than said select transistor, and wherein programming voltages higher than a normal operating voltage are applied only to said programming transistor.

8. The device of claim 7, further comprising means for, during normal operation, switching said programming transistor on at all times, connecting the supply voltage to ground, and switching said select transistor on in response to a high voltage applied to its control input, whereby, when said select transistor is switched on, the product term signal line is connected to ground if said floating gate transistor is controlled to be on by the floating gate, and the output signal line is not connected to ground through the cell otherwise.

* * * * *